United States Patent [19]

Bayer et al.

[11] 4,119,893

[45] Oct. 10, 1978

[54] CIRCUIT FOR FORMING AN ELECTRICAL QUANTITY WHICH IS PROPORTIONAL TO A FLUX COMPONENT IN A ROTATING FIELD MACHINE

[75] Inventors: Karlheinz Bayer; Walter Dreiseitl; Felix Blaschke, all of Erlangen, Germany

[73] Assignee: Siemens Aktiengesellschaft, Berlin and Munich, Germany

[21] Appl. No.: 818,854

[22] Filed: Jul. 25, 1977

[30] Foreign Application Priority Data

Aug. 10, 1976 [DE] Fed. Rep. of Germany ....... 2635965

[51] Int. Cl.$^2$ ............................................. H02P 7/36
[52] U.S. Cl. ................................... 318/178; 318/189; 318/227
[58] Field of Search ............... 318/178, 189, 227, 230, 318/231

[56] References Cited

U.S. PATENT DOCUMENTS

| | | | |
|---|---|---|---|
| 3,512,067 | 5/1970 | Landau | 318/227 |
| 3,593,083 | 7/1971 | Blaschke | 318/227 |
| 4,041,361 | 8/1977 | Cornell | 318/227 |
| 4,044,284 | 8/1977 | Plunkett et al. | 318/227 |

*Primary Examiner*—Gene Z. Rubinson
*Attorney, Agent, or Firm*—Kenyon & Kenyon, Reilly, Carr & Chapin

[57] ABSTRACT

A circuit for forming an electrical quantity which is proportional to a flux component of a rotating field machine permitting an accurate measurement of the flux component during the starting up of the rotating field machine, the machine having for this purpose, two windings of which the first winding is suited for excitation and the second winding for taking off a voltage induced by the excitation, the circuit including an integrator preceded by an adder to which are fed as input variables the phase current, the time derivative of the same, the phase voltage of the rotating field machine, and the induced voltage, with a null regulator which can be switched on via an auxiliary switch after the excitation is switched on connected into the feedback path of the integrator, and a quantity proportional to the flux component taken off at the output of the integrator.

4 Claims, 8 Drawing Figures

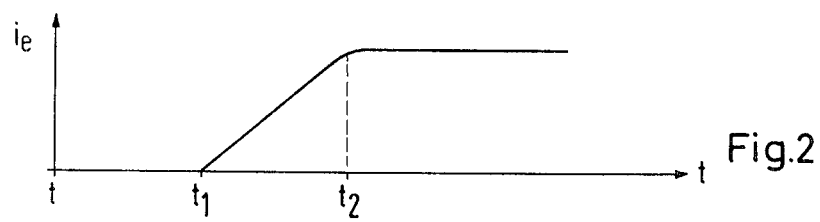
Fig.2
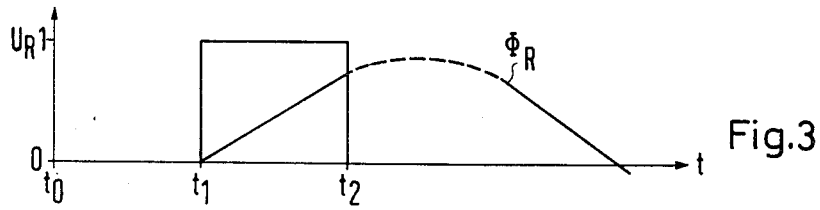
Fig.3
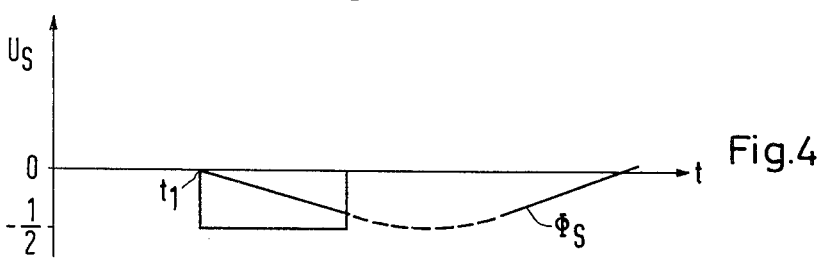
Fig.4
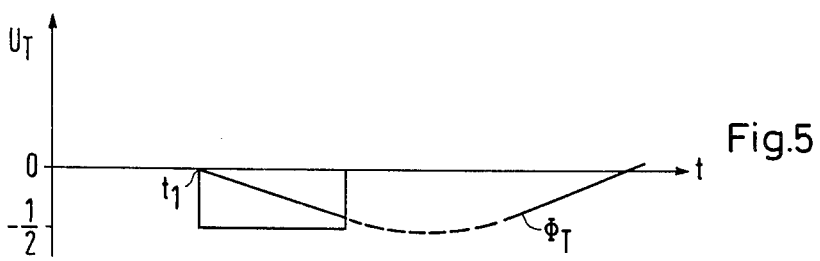
Fig.5
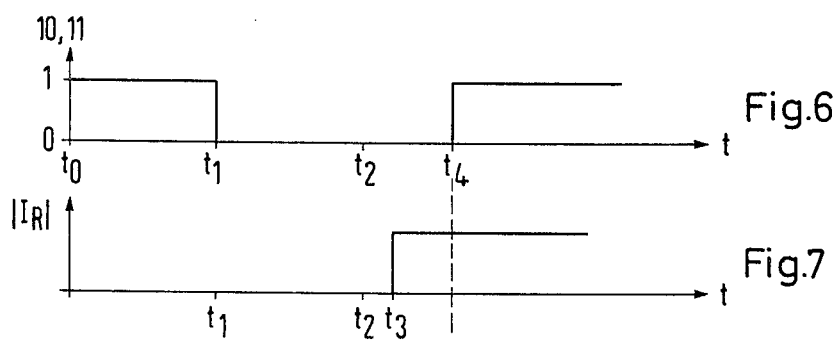
Fig.6
Fig.7
Fig.8

CIRCUIT FOR FORMING AN ELECTRICAL QUANTITY WHICH IS PROPORTIONAL TO A FLUX COMPONENT IN A ROTATING FIELD MACHINE

BACKGROUND OF THE INVENTION

This invention relates to rotating field machines in general and more particularly to a circuit for forming an electrical quantity which is proportional to a flux component in a rotating field machine.

Circuits of this general nature in which the rotating field machine has a first winding provided for the excitation and which comprise: an adder, to which a voltage proportional to the phase current in a lead of the machine, a voltage proportional to the differential quotient with respect to time of the phase current and a voltage proportional to the corresponding phase voltage are fed; an integrator which follows the adder and at the output of which the quantity proportional to the flux component is taken off; and a null regulator with PI characteristic which is designed for suppressing the d-c component of said quantity and the input of which is connected to the output of the integrator and the output of which is connected to a summing point at the input of the integrator are known. Such a circuit is shown in FIG. 4 of U.S. Pat. No. 3,593,083.

The known circuit forms the information regarding the position and magnitude of the flux vector in the rotating field machine directly from the terminal voltage and current. In a three phase machine, it is sufficient to measure the phase voltage and the phase current only twice. The circuit initially determines the main field voltage of the rotating field machine by subtracting the ohmic and the inductive voltage drop from the phase voltage, and subsequently determines the flux component by integration of the main field voltage. Two flux components determine the position of the flux vector and its magnitude.

Information regarding the position and magnitude of the flux vector makes it possible to operate the rotating field machine with field orientation (see Siemens-Zeitschrift 1971, pages 765 to 768 and U.S. Pat. No. 3,909,688).

When starting the rotating field machine, it is of particular importance to determine the flux components as accurately as possible. In the worst case, a false measurement can lead to an inability to start the rotating field machine.

From the circuit described in U.S. Pat. No. 3,593,083, it has been found that a sufficiently accurate determination of the position and magnitude of the flux vector, i.e., of the individual flux components, by direct measurement of the terminal voltage and current is possible only if, after the main switch and the excitation have been switched on, the rotating field machine has reached a speed which is a few percent, say, 5%, of the nominal speed. At lower speeds, the ohmic voltage drop, which is given by the product of the phase current and the ohmic resistance of the phase winding supplied and which is added in the adder is of the order of magnitude of the main field voltage to be determined, which causes considerable errors. Field oriented operation is therefore not possible during starting.

SUMMARY OF THE INVENTION

It is an object of the present invention to develop the circuit mentioned at the outset in such a manner that accurate determination of the flux component during the starting of the rotating field machine is possible and such that the flux component can also be determined with sufficient accuracy when the speed increases.

Further, an operating procedure for the circuit according to the invention is to be provided, by which a sufficiently accurate determination of the flux component is possible during the starting of the rotating field machine and also at higher speed.

According to the present invention, this problem is solved by providing the rotating field machine with a second winding suitable for measuring an induced voltage; by feeding a voltage which is proportional to the voltage induced in the second winding to the adder stage; and by connecting the output of the null regulator to the summing point via an auxiliary switch which is closed after the excitation process in the rotating field machine is completed.

In contrast to the circuit described in U.S. Pat. No. 3,593,083 the circuit according to the invention assumes that the null regulator is not connected to the integrator at the beginning but that the connection is rather accomplished during the starting process of the rotating field machine.

As an example of a rotating field machine, a synchronous machine which has a stator and a field winding is primarily considered in the present specification. However, the present invention can be applied as well to other rotating field machine types, as long as they have two windings, of which the first winding is suited for switching on the excitation and the second winding for measuring the voltage induced in itself in the process. Therefore, an asynchronous machine which, besides the working winding (first winding) has an additional winding which is separate from the working winding and is suited for measuring (second winding) can also be used in connection with the invention. The present invention can also be used, however, with a rotating field machine which has two mutually shifted three phase windings. According to the state of the art, such a rotating field machine is used for obtaining twelve pulse operation of two converters with six pulse operation.

So far it has been assumed that the circuit simulates only a single flux component. For forming a further flux component, a similar circuit is provided which determines the measuring quantities phase voltage and phase current in the other machine lead. In such a further embodiment, the two auxiliary switches now provided must be capable of being switched on simultaneously. The two flux components determine the position and the magnitude of the flux vector.

A procedure for operating this circuit according to the invention includes executing the individual switching actions for starting the rotating field machine in the following time sequence:

a. first, with the main switch in the machine leads open, the auxiliary switch between the null regulator and the integrator is briefly closed, whereby the integrator is set to zero.

b. then the first winding is connected to a voltage source to excite the rotating field machine, and from the phase voltage induced in the second winding, the initial position of the flux component is determined by means of the integrator, c. not earlier than simultaneously with switching on the excitation, the main switch in the machine leads is closed, and d. some time later, the auxiliary switch is closed.

In the case of a synchronous machine, an advantageous further embodiment of this method is distinguished by the feature that, for the purpose of switching on the excitation with the stator winding (second winding) disconnected, a voltage step is applied to the field winding (first winding) of the synchronous machine. It must be kept in mind, however, that the voltage rise at the field winding can also be gradual. The induced voltage then is smaller, however.

The present invention is based on the discovery that the flux component can be determined very accurately with the known circuit while the rotating field machine is standing still, if the excitation is switched on first, with the main switch open. Then, the flux component can be obtained, without the interfering additon of current dependent quantities, from the transformed voltage when this excitation is switched on, and specifically without the null regulator being switched on (flux localization). In the case of a synchronous machine, the field winding is switched on for this purpose first, i.e., connected to a voltage source. While the field current is building up, the measurement of the flux component is made. In an asynchronous machine, which comprises a main winding and a supplementary winding, on the other hand, the main winding is switched on for this purpose. The excitation of the asynchronous machine is brought about when it is switched on. The voltage induced in the supplementary winding is measured and evaluated in the circuit in forming the flux component. In all cases, the measuring winding is open during the measurement (in the case of a synchronous machine, the measuring winding is the stator winding, and in the case of an asynchronous machine, the supplementary winding), so that no phase current can flow. Then, the product of the resistance and the phase current is also zero. Therefore, the two voltages which are proportional to the phase current and its time derivative and are fed to the summing point, are also equal to zero. Thus, the main error source in the known circuit during the starting of the rotating field machine is eliminated.

Switching on the null regulator only after the initial determination of the flux component (flux localization) has the following reasons: The null regulator would tend in the flux localization to regulate toward zero the intergrated up initial values determined by the integrator, and to thereby falsify the determination.

After being switched into the circuit, the null regulator has the purpose, as in the known circuit of compensating the d-c contents of the flux component which occur in normal operation.

As long as the flux in the rotating field machine is changing when the excitation is switched on, the individual phase voltages (interlinked voltages) are induced. These phase voltages therefore change the output voltage of the integrator, which is proportional to the flux component. If the flux no longer changes, then the induced terminal voltages becomes zero and the integrator retains the integrated information. According to the known method of transvector control (cf., Siemens-Zeitschrift 1971, pages 765 to 768), this information can be used for relating the desired current value to the flux. By correctly setting the integrator due to the closing of the auxiliary switch prior to switching on the excitation, the circuit yields a correct image of the flux at any time even if the rotational voltage is measured. Thus, the current can always be given in a defined position relative to the flux in the transvector control from the lowest speed on.

If the rotating field machine is already rotating, for instance, due to a coupled load, during the build up of the excitation, this places no limitation on the functional operability of the circuit according to the invention and the operating procedure according to the invention. It should also be pointed out that it is possible with this circuit and this procedure, under certain conditions, to change the direction of rotation.

The phase voltage required in this circuit can always be determined by measuring the conductor voltages (interlinked voltages) and suitable interlinking. In a three phase system, it is only necessary to measure two conductor voltages, for instance, for determining a phase voltage.

The time between closing the main switch, when the excitation should have in any event reached its full final value, and closing the auxiliary switch can be determined from various aspects. This time will differ depending on the application and the design of the further components, e.g., in superimposed control loops. It may be advantageous, for instance, to close the auxiliary switch at a certain speed, say, 5% or 10% of the nominal speed. It may also be advantageous, however, to switch the null regulator into the circuit only when the ripple at the output of the null regulator has fallen below a predetermined limit. In a general case, this time can be chosen equal to several periods of the operating frequency. A further consideration, which may be of importance in choosing the time delay for the closing of the auxiliary switch, is the magnitude of the output voltage of the adder. For instance, the auxiliary switch can be closed after this output voltage has reached 1% to 5% of the voltage value in nominal operation.

BRIEF DESCRIPTION OF THE DRAWINGS

FIG. 2 illustrates the waveform of the field current as a function of time.

FIG. 3 illustrates the waveform of a phase voltage and the corresponding flux component as a function of time.

FIG. 4 illustrates the waveshape of a further phase voltage and the corresponding flux component as a function of time.

FIG. 5 illustrates the waveform of a further phase voltage and the corresponding flux component as a function of time.

FIG. 6 illustrates the states of the two auxiliary switches of FIG. 1 as a function of time.

FIG. 7 illustrates the waveform of a phase current of the rotating field machine as a function of time.

FIG. 8 illustrates the waveform of the speed of the rotating field machine as a function of time.

DETAILED DESCRIPTION OF THE INVENTION

Figure 1:
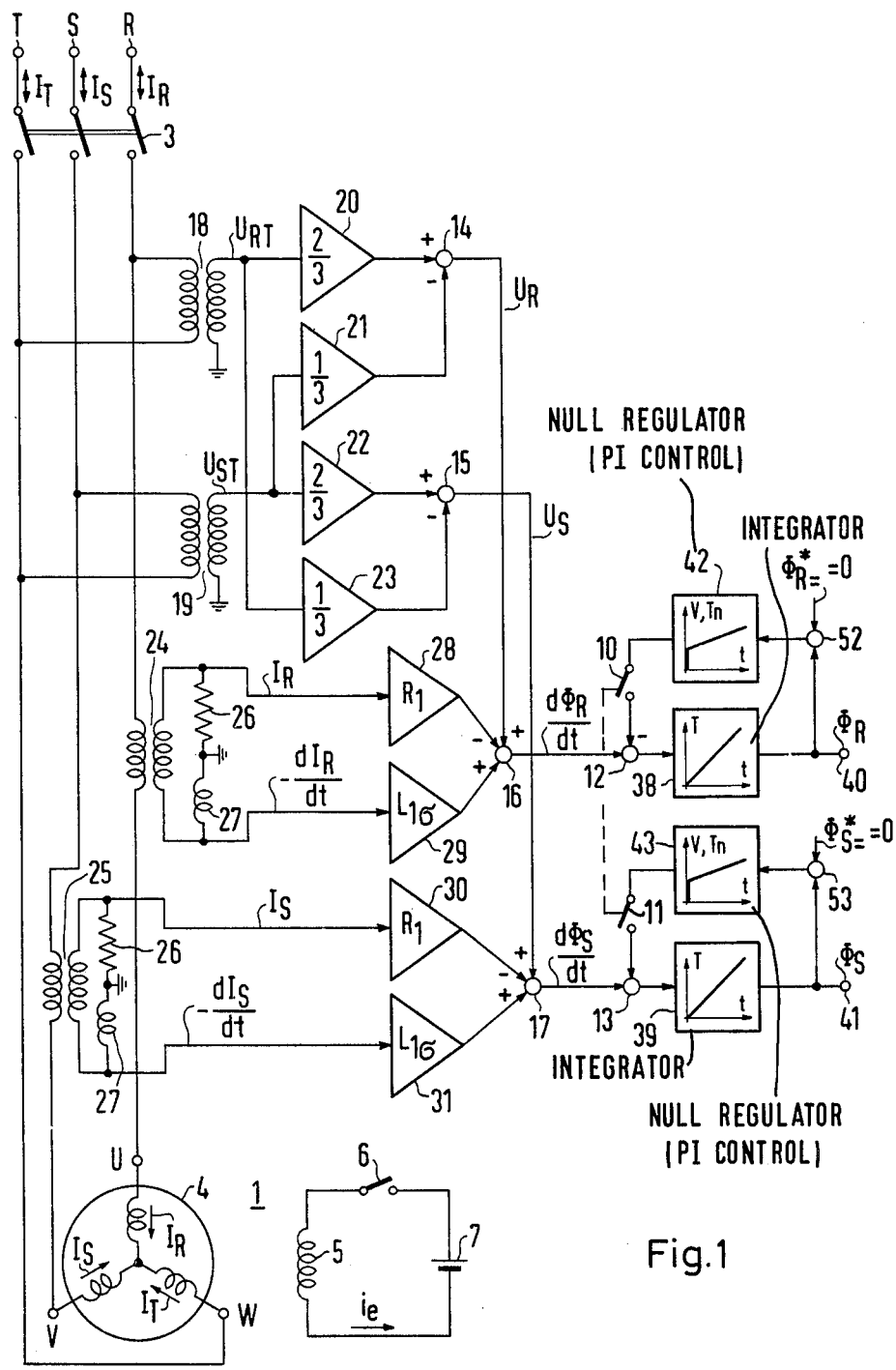
FIG. 1 is a block diagram of a circuit for forming two electrical quantities which are proportional to two flux components in a rotating field machine.

FIG. 1 shows a circuit for forming two electrical quantities which are proportional to the flux components $\phi_R$ and $\phi_S$ in a rotating field machine 1. These two flux components $\phi_R$, $\phi_S$, from which the third flux component $\phi_T$ can be derived by an electrical interlinking circuit (not shown), are actual values which are used for controlling the three phase rotating field machine. As an example of a rotating field machine 1 is presently considered particularly a synchronous machine, the Y-connected stator winding of which is designated 4, and the field winding 5.

The stator winding 4 has its terminals U, V, W connected to a three phase network R, S, T via a three pole main switch 3. The network R, S, T may be formed by a static frequency converter. The field winding 5 can be connected to a d-c voltage source 7 via a switch 6. The field current flowing after closing is designated as $i_e$.

The instananeous values of the flux components $\phi_R$ and $\phi_S$ of the fluxes occurring in the phase R and S are formed from the primary quantities of the rotating field machine 1 by means of the circuit shown. Since, in general, the neutral point of the synchronous machine 1 is not directly accessible, two voltage transformers 18 and 19 are provided on the primary side, and have their primaries coupled to the phases R, T and S, T, respectively. Their secondary output voltages $U_{RT}$ and $U_{ST}$ are fed to operational amplifiers 20 to 23. The respective gains of amplifiers 20 to 23 are indicated in the amplifier symbols. The output voltages of the operational amplifiers 20 and 21 as well as of amplifiers 22 and 23 are brought to respective summing junctions 14 and 15 and are added there in accordance with the signs indicated. Thus, quantities proportional to the phase voltages $U_R$ and $U_S$ appear at the outputs of these summing junctions and 14 and 15.

For forming the quantities corresponding to the phase currents $I_R$ and $I_S$ as well as their derivatives with respect to time, two current transformers 24 and 25 are arranged in the leads to the motor phases U, V. These are terminated on the secondary side with loads each consisting of an ohmic resistance 26 in series with a choke 27. The junction between the ohmic resistor 26 and the choke 27 is connected to the reference potential (ground) of operational amplifiers 28 to 31. The voltage dropping at the resistors 26 with respect to ground can therefore be considered as a measure for the respective phase currents $I_R$ and $I_S$. The voltage measured at the choke 27 with respect to ground then corresponds to the negative value of the time derivative of the respective phase currents $I_R$ and $I_S$.

Both ends of the secondary winding of the current transformers 24 and 25 are brought to the inputs of the operational amplifiers 28 to 31. The output voltages of the operational amplifiers 28 and 29 as well as the output voltage of the summing junction 14 are added at a summing junction or adder 16 with the signs indicated. Correspondingly, the output voltages of the amplifiers 30 and 31 as well as of the summing junction 15 are also added in at a summing junction of adder 17 with the signs indicated. At the output of each of the two adders 16, 17, there appears an output voltage (induced main field voltage), which is proportional to the time derivative of the instantaneous value of the phase fluxes $\phi_R$ and $\phi_S$, respectively.

These output voltages are fed to summing junctions 12 and 13, respectively. Here, the summing junction 12 is associated with the input of an integrator 38 and the summing junction 13 with the input of an integrator 39. The output of the integrator 38 is brought to an output terminal 40 and the output of the integrator 39 to an output terminal 41. At these output terminals 40 and 41 appear the instantaneous values of the phase fluxes $\phi_R$ and $\phi_S$ in the form of proportional output voltages.

Since the instantaneous values of the phase fluxes $\phi_R$ and $\phi_S$, as to their waveforms, are pure alternating quantities, but electronic integrators have a tendency to show null shifts due to shift phenomena, which bring about a falsifying d-c component or also a-c components of low frequency, the integrators 38 and 39 are provided with negative feedback by means of null regulators 42 and 43 with PI (proportional integral, two-term) characteristics. The null regulator 42, has a summing junction or comparator 52 at its input receiving an input from the output of the integrator 38. The output of the null regulator 42 is coupled via an auxiliary switch 10 as a negative input to the summing junction 12. In the comparator 52, the actual value of the flux component $\phi_R$ is compared with a reference value $\phi_R^* = 0$. Similarly, the null regulator 43, has a comparator 53, having an input connected to the output of the integrator 39. The null regulator 43 is coupled via a further auxiliary switch 11 to the summing junction 13 with a negative sign. In the comparator 53, the actual value of the flux component $\phi_S$ is compared with a reference value $\phi_S^* = 0$. The two null regulators serve to effectively suppress d-c components at higher speeds.

The procedure for operating the circuit according to FIG. 1 can be seen from the timing diagrams of FIGS. 2 to 8. Here, the two auxiliary switches 10, 11 are first closed at a time $t_0$ and then opened at a time $t_1$ (FIG. 6). As a result the two integrators 38 and 39 are regulated to an initial value of zero.

At the time $t_1$, the switch 6 is thereupon closed, so that a field current $i_e$ can build up in the field winding 5 (see FIG. 2). The build up of the excitation is approximately completed at a time $t_2$. During the time interval from the time $t_0$ to the time $t_2$, the main switch 3 is open. During the build up of the excitation, a transformed phase voltage $U_R U_S$, $U_T$ develops in the stator winding of the rotating field machine, which serves here as the measuring winding, through transformer transmission. The waveforms of these phase voltages can be seen from FIGS. 3 to 5. From them, the initial values of the two flux components $\phi_R$, $\phi_S$ are measured by means of the circuit in FIG. 1. Since no phase current $I_R$, $I_S$ can flow with the main switch 3 open, the amplifiers 28 to 31 furnish no contributions to the output voltages of the adders 16 and 17.

In FIGS. 3 to 5, the corresponding waveforms of the flux components $\phi_R$, $\phi_S$, $\phi_T$ are also shown. At the time $t_2$, these flux components have reached magnitudes sufficient for further processing. At a time $t_3$, the main switch 3 is closed. Thereby, a phase current $I_R$ begins to flow (FIG. 7). After the main switch 3 is closed, the rotating field machine 1 starts to turn. This can be seen from FIG. 8. When the speed $n$ has assumed a value of say, 5% of the nominal speed $n_n$, each of the two switches 10 and 11 is closed at a time $t_4$, according to FIG. 6. As shown by FIG. 1 switches 10 and 11 are tied together so that both are opened and closed at the same time. Thus, the two null regulators 42, 43 are also fully effective for suppressing d-c components at higher speeds.

What is claimed is:

1. In a circuit for forming an electrical quantity which is proportional to a flux component of a rotating field machine, wherein the rotating field machine has a first winding provided for excitation, the circuit comprising an adder, to which are fed a voltage proportional to the phase current in a machine lead, a voltage porportional to the differential coefficient of the phase current with respect to time and a voltage proportional to the corresponding phase voltage; and an integrator which follows the adder and at the output of which the quantity proportional to the flux component is taken off; and a null regulator with PI characteristics designed to suppress the d-c component of this quantity, the input of which is connected to the output of the integrator and the output of which is connected to a summing junction at the input of the integrator, the improvement comprising the rotating field machine also having a second winding suitable for measuring an induced voltage; means coupling a voltage which is proportional to the voltage induced in the second winding to the adder stage; and an auxiliary switch which can be switched on after the excitation process in the rotating field machine is completed coupling the output of the null regulator to the summing junction.

2. The improvement according to claim 1, and further including an identical circuit arrangement for forming a further flux component for another machine phase and wherein the two auxiliary switches are adapted to be closed simultaneously.

3. A method for operating a circuit for forming an electrical quantity which is proportional to a flux component of a rotating field machine, wherein the rotating field machine has a first winding provided for excitation, a second winding suitable for measuring an induced voltage, said machine having a switch for connecting the first winding to an excitation source and a main switch in the machine leads, comprising an adder, to which are fed a voltage proportional to the phase current in a machine lead, a voltage proportional to the differential coefficient of the phase current with respect to time, a voltage proportional to the voltage induced in the second winding and a voltage proportional to the corresponding phase voltage; an integrator which follows the adder and at the output of which the quantity proportional to the flux component is taken off; and a null regulator with PI characteristics designed to suppress the d-c component of this quantity, the input of which is connected to the output of the integrator and the output of which is connected to a summing junction at the input of the integrator through an auxiliary switch, comprising executing the following switching actions in the following time sequence during the starting of the rotating field machine:

a. first, with the main switch in the machine leads open, closing the auxiliary switch between the null regulator and the integrator, whereby the integrator is set to zero;

b. then opening the auxiliary switch;

c. then connecting the first winding to a voltage source to excite the rotating field machine whereby, from the phase voltage induced in the second winding, the initial position of the flux component is determined by means of the integrator;

d. not earlier than simultaneously with switching on the excitation, closing the main switch in the machine leads; and e. some time later, closing the auxiliary switch.

4. The method according to claim 3 for a synchronous machine, wherein a voltage step is applied to the field winding of the synchronous machine for switching on the excitation, with the stator winding disconnected.

* * * * *